United States Patent
Montano et al.

(10) Patent No.: US 6,752,878 B2
(45) Date of Patent: Jun. 22, 2004

(54) PROCESS FOR TREATING ADHESION PROMOTED METAL SURFACES

(75) Inventors: Joseph R. Montano, Boston, MA (US); Wade Sonnenberg, Upton, MA (US); Mark J. Kapeckas, Marlborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/956,386

(22) Filed: Sep. 19, 2001

(65) Prior Publication Data

US 2002/0108678 A1 Aug. 15, 2002

Related U.S. Application Data

(60) Provisional application No. 60/233,515, filed on Sep. 19, 2000.

(51) Int. Cl.⁷ ................................................. C23C 22/00
(52) U.S. Cl. ........................ 148/243; 148/272; 148/274; 148/284; 427/96; 427/126.3; 427/309
(58) Field of Search ................................. 148/243, 272, 148/274, 284; 427/96, 126.3, 309

(56) References Cited

U.S. PATENT DOCUMENTS

| | | | |
|---|---|---|---|
| 5,492,595 A | | 2/1996 | Carano et al. |
| 5,861,076 A | * | 1/1999 | Adlam et al. ............... 156/281 |
| 6,020,029 A | * | 2/2000 | Ferrier et al. ............... 427/333 |
| 6,054,061 A | | 4/2000 | Bayes et al. |
| 6,117,250 A | * | 9/2000 | Schemenaur et al. ....... 148/248 |

FOREIGN PATENT DOCUMENTS

| | | |
|---|---|---|
| EP | 0 887 439 | 12/1998 |
| EP | 1 104 227 A2 | 5/2001 |
| EP | 1 209 253 A2 | 5/2002 |

* cited by examiner

*Primary Examiner*—Andrew L. Oltmans
(74) *Attorney, Agent, or Firm*—John J. Piskorski

(57) ABSTRACT

A method for treating a micro-roughened metal surface to improve bonding between the metal surface and a polymer material. The method involves post-treating the micro-roughened conversion coated metal surface with an aqueous wetting agent composition after having formed the micro-roughened conversion coated metal surface with an adhesion promotion composition. The method can be employed in the circuit board industry to improve bonding between layers in multilayer circuit boards.

14 Claims, No Drawings

PROCESS FOR TREATING ADHESION PROMOTED METAL SURFACES

The present application claims the benefit of U.S. provisional application No. 60/233,515, filed Sep. 19, 2000, incorporated herein by reference in its entirety.

BACKGROUND OF THE INVENTION

1. Field of the Invention

The present invention is directed to a method of improving adhesion between metal and polymeric materials. More specifically, the present invention is directed to a method of improving adhesion between metal and polymeric materials by treating the metal with an aqueous wetting agent composition following an adhesion promotion step.

2. Background

Printed circuits containing one or more circuitry innerlayers are in prominent use today as demand increases for further and further weight and space conservation in electronic devices.

In a fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuitry by interposing one or more partially-cured dielectric substrate material layers (so called "pre preg" layers) between the circuitry innerlayers to form a composite of on alternating circuitry innerlayers and dielectric substrate material. The composite is then subjected to heat and pressure to cure the partially cured substrate material and achieve bonding of circuitry innerlayers thereto. The cured composite will then have a number of through holes drilled therethrough, which are then metallized to provide a means for conductively interconnecting all circuitry layers. In the course of the through hole metallizing process, desired circuitry patterns will also typically be formed on the outer facing layers of the multilayer composite.

An alternate approach to the formation of a multilayer printed circuit board is through additive or surface laminar circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. O. Osborne, "An Alternate Route To Red Oxide For Inner Layers", PC Fab. August, 1984, as well as variations involving direct formation of red oxide adhesion promoter, with varying degrees of success being obtained. U.S. Pat. Nos. 4,409,037 and 4,844,981 to Landau, the teachings both of which are incorporated herein by reference in their entirety, report certain oxides formed from relatively high chlorite/relatively low caustic copper oxidizing compositions, and producing substantially improved results in circuitry inner layer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit. The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of shear volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani reports a certain process in which the copper surfaces of the circuitry innerlayers are first provided with a copper oxide coating and then contacted with an aqueous chromic acid solution before the circuitry innerlayers are incorporated into the multilayer assembly. The treatment is said to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al., U.S. Pat. No. 4,902,551 to Nakaso et al., and U.S. Pat. No. 4,981,560 to Kajihara et al., and a number of references cited therein, relate to certain processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-coppper oxide over (2) copper of the copper foil) which are prone to separation/delamination along the phase boundary.

U.S. Pat. Nos. 4,997,722 and 4,997,516 to Adler report formation of a certain copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reports a certain process whereby an adhesion promotion layer of copper oxide is formed on the circuit elements followed by a controlled dissolution and removal of a substantial amount of the copper oxide in a manner which does not adversely affect the topography.

PCT Application No. WO96/19097 to McGrath, the teachings of which are incorporated by reference herein in their entirety, reports a certain process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130, to Ferrier entitled "Process For Improving Adhesion of Polymeric Materials to Metal Surfaces" reports a certain process for improving the adhesion of polymeric materials to a metal surface, especially copper or copper alloy surfaces in the production of multilayer printed circuits. The described process provides for contacting the metal surface with a certain adhesion-promoting composition comprising (a) an oxidizer; (b) an acid; (c) a corrosion inhibitor; (d) a source of halide ions; and (e) optionally, a water soluble polymer. That process is said to provide enhanced adhesion between the metallic and polymeric surfaces (i.e. the circuitry and the intermediate insulating layer), while eliminating or minimizing pink ring and operating economically, as compared to above noted conventional processes.

However, it has been found that the use of acidic peroxide treatment solutions, while giving good peel strength and stability of copper laminated to fiberglass filled resin, allows the occurrence of sore flaws on further processing of the laminated board to create a finished printed circuit board. Thus, with some resin systems, particularly lower $T_g$ materials, drilling removes a small quantity of organic material from the surface of the etch treated copper at the point where the drill intersects with the copper layer; this phenomenon is called "wedge". Further processing the drilled board through the chemical steps of preparing and plating the board created a small area at the treated copper surface around the drilled hole where the coating is attacked and removed, creating a phenomenon called "pink ring". This area of pink ring is much smaller than the pink ring observed in standard oxide processing to prepare copper surfaces for lamination. Nevertheless, in this area of attack small areas of resin contracting from the copper surface can be observed after floating the board in molten solder. Although these areas of resin contraction (called "resin voids") may not be sufficient cause for rejection of the board they are still a concern.

In particular, it has been found that these wedge, pink ring and resin void flaws can be greatly reduced or eliminated by processing the board treated with these acidic peroxide treatment solutions through a strongly alkaline post treatment, followed by rinsing and drying.

U.S. Pat. No. 6,020,029 to Ferrier et al. reports an acidic peroxide, adhesion promotion composition containing an oxidizer, an acid, a corrosion inhibitor, optionally a source of halide ions and optionally a water soluble polymer. Preferably, the water-soluble polymer is not a wetting agent or surfactant, but a water soluble homopolymer or copolymer of low molecular weight. The composition is applied to a metal surface. After the acidic peroxide solution is applied to the metal, the metal is post-treated with a strong alkaline solution followed by rinsing with water. After the metal is so post-treated, a polymeric material is bonded to the metal surface. The '029 patent alleges that the combination of the halide and water soluble polymer in the acidic peroxide composition provide the best bonding results between the metal surface and the polymeric material.

WO 00-02426 discloses another method for addressing bond integrity between a metal surface and a polymeric coating. The method reported in WO 00-02426 to convert cupric-based organometallic compounds into cuprous-based organometallic conversion coatings to improve bonding integrity. The process is achieved by reduction and/or by partial dissolution of the organometallic coating, and optionally applying a copper oxidation inhibitor. Reducing agents employed include aminoboranes and dissolution agents include cupric ion chelators, organic or inorganic acids and their salts. Copper oxidation inhibitors include azole derivatives, including halogen substituted derivatives thereof. Cationic, amphoteric, anionic and/or non-ionic surface active agents may be included in the composition to enhance the effectiveness of the composition.

Although there are numerous methods of improving, the bonding integrity between a metal surface and a polymeric material, there is still a desire and a need in the circuit board industry to increase adhesion between a metal surface and a polymeric material. Many of the above disclosed methods employ treatment solutions that are acidic or alkaline and cause tile formation of nooks and crannies on the metal surface. However, none of the above-disclosed methods attempt to exploit the rough metal surface to further enhance bonding between the metal and the polymeric material.

Accordingly, there is a need for a process that exploits the surface roughness of the metal to improve the adhesive properties between the metal and polymeric material.

SUMMARY OF THE INVENTION

The invention provides new methods for treating metal surfaces, such as a copper surface of a copper-clad printed circuit board laminate. These methods can provide significantly improved peel strengths of an applied polymer laminate, such as epoxy resin and the like.

More particularly, preferred methods of the invention include treatment of a metal surface with an adhesion promotion composition followed by treatment with a wetting agent composition. Thereafter, a polymer composition (laminate) is applied to the metal surface.

Without being bound by any theory, the aqueous wetting agent composition preferably can provide a micro-roughened (e.g. nooks and crannies) surface, thereby rendering the metal surface more accessible to contact with a polymeric material to be coated on the metal surface. After the treated metal surface is post-treated with the aqueous wetting agent composition, the polymeric material is placed on the surface of the metal to form a high integrity bond between the metal surface and the polymer material. Advantageously, the method and wetting agent composition of the present invention provide for improved adhesion between a metal surface and a polymeric material as compared with known adhesion promoting processes. Accordingly, the adhesion between the metal surface and the polymeric material is such that multilayer circuit boards prepared using the method of the present invention may be readily handled by workers without concern of the polymeric material peeling from the metal surface.

Importantly, the aqueous wetting composition post-treatment of the present invention prolongs the life of the final product. Multilayer circuit boards post-treated in accordance with the present invention and installed in electronic equipment do not delaminate as readily over time as multilayer circuit boards that were not post-treated. Thus the electronic products have an improved life.

Also, the post-treatment method of the present invention may be employed with many different adhesion promotion treatments to further improve adhesion between a metal surface and a polymeric material. Thus the process of the present invention is a readily available means of improving the adhesion promoting methods known in the circuit board industry.

An objective of the present invention is to provide a means of improving the adhesion integrity between a metal surface and a polymeric material.

Another objective is to provide an improved peel strength between a metal surface and a polymeric coating.

An additional objective of the present invention is to provide a multilayer circuit board that can readily be processed through various manufacturing steps without the concern of the polymeric coating separating from the metal surface.

A further objective of the present invention is to provide a method of improving adhesion between a metal surface and a polymeric material that can be employed to improve known adhesion methods.

Additional objectives and advantages of the present invention will be apparent to those of skill in the art after reading the following description of the invention and the appended claims.

DETAILED DESCRIPTION OF THE INVENTION

As discussed above, the invention includes processes for improving the adhesion between a metal surface and a polymeric material by treating the metal surface with an adhesion promotion composition followed by contacting the treated metal surface with an aqueous wetting agent composition.

The aqueous composition is employed as a post treatment step after treating a metal surface with an adhesion promoting composition. The adhesion promoting composition preferably can produce a micro-roughened surface, i.e. nooks and crannies on a metal substrate. While not being bound by any particular theory or mechanism, it is believed that post-treatment of the metal surface with the aqueous wetting agent composition permits the wetting agents to penetrate the nooks and crannies to reduce surface tension between the nooks and crannies and the polymer material and/or planarize the metal surface. A wetting agent within the scope of the present invention is an agent in a suitable quantity such that the agent provides contact between a polymeric material and the nooks and crannies of a micro-roughened metal surface. Preferably, the aqueous wetting agent composition contains the wetting agent and water without additional additives.

The present process is particularly suited to the manufacture of multilayer printed circuit boards. Thus, in this application, the metal circuitry (usually copper) of the innerlayers is treated with an adhesion-promoting composition. After adhesion promotion treatment, optionally followed by water rinsing, the innerlayers are post-treated with an aqueous wetting agent composition. Optionally, another rinsing step may be employed before applying the polymer to the metal. The innerlayers are bonded together with polymeric materials such as pre-pregs or imageable dielectrics, resulting in the multilayer printed circuit board.

The metal surface to be treated may comprise a variety of metals such as copper, nickel, iron and alloys of each of the foregoing. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

Any suitable water miscible wetting agent may be employed to practice the present invention as long as the agent falls within the scope of the definition of wetting agent as defined above. Examples of suitable water miscible, wetting agents include, but are not limited to, glycols such as polyethylene glycol, polypropylene glycol, polybutylene glycol, isobutylene glycol and the like.

Suitable glycol ethers include, but are not limited to, water miscible glycol ethers such ethylene glycol monomethyl ether, diethylene glycol monomethyl ether, propylene glycol monomethyl ether, propylene glycol dimethyl ether, dipropylene glycol dimethyl ether, dipropylene glycol mono-n-butyl ether, dipropylene glycol monomethyl ether, dipropylene glycol monomethyl ether, and the like. Other suitable glycol ethers, but less preferred, are glycol mono ($C_1$–$C_6$)alky ethers and glycol di($C_1$–$C_6$)alkyl ethers, such as but not limited to ($C_1$–$C_{20}$)alkanediol ($C_1$–$C_6$)alkyl ethers and ($C_1$–$C_{20}$)alkanediol di($C_1$–$C_6$)alkyl ethers. The acetates of the above disclosed glycol ethers also may be employed.

Suitable poly(alkylene oxide) polymers, also useful as wetting agents, include, but are not limited to, poly (propylene oxide), poly(ethylene oxide), polyethylene oxide/propylene oxide), polypropylene glycol)(meth) acrylates, polypropylene glycol) alkyl ether(meth)acrylates, poly(propylene glycol) phenyl ether(meth)acrylates, poly (propylene glycol) 4-nonylphenol ether(meth)acrylates, poly(ethylene glycol)(meth)acrylates, poly(ethylene glycol) alkyl ether(meth)acrylates, poly(ethylene glycol) phenyl ether methacrylates, polypropylene/ethylene glycol) alkyl ether(meth) acrylates and mixtures thereof. The di- and tri-(alkylene oxide) polymers also may be employed.

Additional suitable wetting agents that can be employed include ethoxylated alkylphenols, fatty acid ethoxylates, fatty alcohol ethoxylates, ethylene oxide/propylene oxide (EO/PO) copolymers and the like. The ethylene oxide/propylene oxide copolymers are obtainable from BASF, Wyandotte Michigan, and are known by the tradenames Pluronics® and Tetronics®.

The preferred wetting agents are the glycols, such as polyethylene glycol, and the ethylene oxide/propylene oxide copolymers or Pluronics®.

The wetting agents are employed in an aqueous composition in amounts sufficient to permit a polymeric material to contact the nooks and crannies of a metal surface. The amount of wetting agent in the composition ranges from about 0.5% by weight to about 30% by weight, preferably from about 1% by weight to about 15% by weight of the composition, most preferably from about 1.5% to about 5%. Preferably, the aqueous wetting agent composition consists essentially of the wetting agent and water.

As mentioned above, any suitable adhesion promoting treatment process can be employed provided that the adhesion promoting composition produces a micro-roughened conversion-coated surface upon the metal. Such surfaces are particularly suited to bonding with polymeric material in contrast to non-treated metal surfaces. Such adhesion promoting baths may contain an oxidizer, an acid and a corrosion inhibitor. Additional components and modifications to such adhesion promoting compositions may be employed as discussed below. Such adhesion promoting compositions have pH ranges from about 2.0 to as high as about 13.0.

The oxidizer used in the adhesion-promoting composition may comprise any oxidizer that is capable of oxidizing the metal surface in the matrix of the adhesion-promoting composition. Hydrogen peroxide and persulfates are particularly preferred oxidizers for use in the process of the invention, with hydrogen peroxide being the most preferred oxidizer. The concentration of the oxidizer in the adhesion-promoting composition may range from at least about 0.01% by weight based on the total weight of the composition to as high as about 60.0% by weight. Preferably, the hydrogen peroxide is present from about 0.1 to about 20% by weight, more preferably from about 0.5% to about 10%, and most preferably from about 1% to about 5%. Hydrogen peroxide is commercially available as, e.g., 35% by weight in water.

The adhesion-promoting compositions optionally may contain a stabilizing agent for hydrogen peroxide. Any suitable stabilizing agent for hydrogen peroxide may be used. Examples include, but are not limited to, dipicolinic acid, diglycolic acid and thiodiglycolic acid, ethylene diamine tetraacetic acid and its derivatives, magnesium salts of an aminopolycarboxylic acid, sodium silicate, phosphates and sulphonates. Stabilizers are added its amounts of from about 0.001% and preferably at least about 0.005% by weight of the adhesion promotion composition. More preferably, the concentration of the stabilizing agent varies between about 0.5 to about 5.0% by weight of the composition.

The acid utilized in the adhesion-promoting composition may be any acid that is stable in the matrix. Preferred acids are inorganic acids and may be employed as a singe acid or a mixture of acids. A variety of inorganic acids may be used including, but not limited to, sulfuric acid, nitric acid, hydrochloric acid, phosphoric acid and mixtures thereof. Sulfuric acid, phosphoric acid or mixtures thereof is especially preferred. When a mixture of inorganic acids is used, the acids may be combined in any suitable ratio. A ratio of from about 99:1 to about 1:99, and preferably from about 75:25 to about 25:75 may be employed. When a mixture of sulfuric acid and phosphoric acid are used, preferably sulfuric acid is used in major amounts and phosphoric in minor amounts. The concentration of the acid in the adhesion-promoting composition may range from about 5 to about 360 grams per liter, preferably from about 70 to about 110 grams per liter.

The corrosion inhibitor used in the adhesion-promoting composition is a compound that effectively reacts with the metal surface to form a protective complex layer. Preferred corrosion inhibitors are pyrroles, azoles, oxazoles, thiazoles, pyrazoles, triazoles, benzotriazoles, tetrazoles, tolyltriazoles, hydroxy-substituted azole compounds, imidazoles, benzimidazoles such as 5-methylbenzimidazole, 2-bromobenzyl benzimidazole, 2-chlorobenzyl benzimidazole, 2-bromophenyl benzimidazole, 2-chlorophenyl benzimidazole, 2-bromophenyl benzimidazole, 2-chloroethylphenyl benzimidazole and 2-undecyl-4-methylimidazole, or mixtures thereof. Hydroxy-substituted azole compounds may have more than one hydroxy substituent and may be further substituted, such as with a (C1–C6)alkyl, (C1–C6)alkoxy, halogen and the like. Suitable hydroxy-substituted azole compounds include, but are not limited to, hydroxy-substituted triazoles and hydroxy-substituted tetrazoles. 1-Hydroxybenzotriazole is a preferred hydroxy-substituted triazole. Examples of suitable benzotriazoles include, but are not limited to, benztriazole, carboxybenzoxtriazole and mixtures thereof. The corrosion inhibitors are available from a variety of commercial sources and may be employed without further purification. The concentration of the corrosion inhibitor in the adhesion-promoting composition may range from about 0.1 to about 20% by weight based on the total weight of the composition, preferably from about 0.2 to about 1% by weight, and most preferably from about 0.3 to about 0.6% by weight.

Optionally, a source of halide ions may be employed in the adhesion-promoting compositions. Any suitable source of halides may be employed as long as the source provides halide ions in the matrix of the adhesion-promoting composition. Examples of suitable sources of halide ions are alkali metal salts such as sodium chloride or potassium chloride, oxohalides such as sodium chlorate or potassium chlorate, or halide bearing mineral acids such as hydrochloric acid. The most preferred sources are halide sources that are free of surfactant groups, such, as tetraalkyl ammonium halides, such as tetraalkyl ammonium chloride, tetrabutyl ammonium chloride and mixtures thereof. The concentration of the source of halide ions in the adhesion-promoting composition may range from about 1 to about 50 ppm. When chloride is employed, the chloride ion is present in amounts of preferably from about 1 to about 8 ppm, most preferably from about 4 to about 7 ppm.

Optionally, the adhesion-promoting composition also comprises a water soluble polymer. The water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide Company under the tradename Carbowax. Particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter.

The adhesion promotion compositions of the present invention preferably are free of surfactants.

An additional component that may be added to the adhesion composition or bath is a non-surfactant amine or a quaternary ammonium compound. The term amine as used herein is defined as a lower aliphatic, cycloaliphatic or aromatic amine, i.e. a primary, secondary or tertiary amine having substitution by groups containing from 1 to about 8 carbon atoms. The term quaternary ammonium compound as used herein is inclusive of lower aliphatic, cycloaliphatic or aromatic amine compound. Each term preferably excludes from its scope materials having fatty substitution or other surfactant groups. Each substituent on the amine may be aliphatic, cycloaliphatic or aromatic and each of such substituents may be further substituted with groups such as carboxyl, nitro, sulfonyl, hydroxyl, and the like. Exemplary amines include methyl amine, dimethylamine, trimethylamine, ethylamine, triethylarnine, tripropylamine, isopropylamine, triallylamine, n-utylamine, t-butylamine, n-amylamine, cyclohexylamine, dicyclohexylamine, and the like. Exemplary quaternary amine or ammonium compounds include tetramethylammonium hydroxide, tetraethylammonium hydroxide, and dimethyl-diethylammonium hydroxide, tetramethylammonium chloride, tetraethylammoium chloride and dimethyl-dimethylammonium chloride. The amines compounds are used in a concentration of from about 0.01% by weight to about 2.5% by weight and more preferably, in a concentration of from about 0.1 to about 1.0% by weight.

Prior to adhesion-promotion and the post-treatment step, the metal surface, particularly copper, or a copper alloy surface, preferably is cleaned by mechanical or chemical cleaning and then contacted with the adhesion-promotion composition. The metal surface can be treated with the adhesion-promoting composition in a variety of ways, including immersion, spray, or flood. The temperature of the adhesion promotion composition during treatment preferably does not exceed 75° C. and more preferably, is at a temperature varying between about 20° C. to about 50° C. Contact time is at least about 1 second and preferably between about 5 seconds and about 2 minutes though the maximum contact time may be up to about 10 minutes. A contact time of about 1 minute or less is particularly preferred.

After the metal surface is treated with the adhesion-promoting composition, the metal is spray-coated or dip-coated or coated by any suitable means in the art with the aqueous wetting agent composition. Such coating methods include both vertical and horizontal methods and apparatus. Contact time between the treated metal and the aqueous wetting agent composition ranges from about 1 second to about 1 minute, preferably, between about 10 to about 30 seconds. Preferably, the post-treatment is done at a temperature of from about 18° C. to about 22° C. (room temperature). The post-treatment process may be performed at higher temperatures, however, there is no advantage to performing the process at temperatures above room temperature. Optionally, the treated metal may be rinsed with water prior to post-treatment and/or prior to placing the polymer material on the metal surface.

The polymer material may be placed on the metal surface to form a bond with the metal surface by any suitable method employed in the art. Mechanical pressure with heat is one method that is very suitable for joining the polymer to the metal surface. The polymer material may be in the forth of a polymeric photoresist, screen-resist solder mask, adhesive material and the like.

In another embodiment of the present invention, the metal surface may be treated with an alkaline solution after the acidic oxidant treatment but prior to the aqueous wetting agent post-treatment. The preferred alkaline solution is an aqueous alkaline solution of alkali metal hydroxide (e.g. sodium hydroxide or potassium hydroxide); alkali metal carbonates (e.g. sodium carbonate or potassium carbonate); alkali metal phosphates (e.g. sodium phosphate or potassium phosphates); or amines or mixtures of those chemicals. The preferred amount of such chemicals in the aqueous solution depends upon the particular chemical-employed as well as the exact use involved. Most preferably an aqueous solution of sodium or potassium hydroxide is used as the alkaline treatment, with the concentration of sodium or potassium hydroxide ranging from 2 to 150 grams per liter, most preferably from 25 to 50 grams per liter. Contact may be made by immersion, conveyorized flood or spray, however conveyorized flood is preferred. Contact time may range from 20 seconds to 10 minutes but 1 to 3 minutes is preferred. Contact temperature may range from room temperature to 85° C. but 20° C. to 40° C. is preferred. This alkaline treatment reduces the number of flaws in the finished laminated product. After the alkaline treatment, the metal surface may be rinsed with water. The treated metal surface is then post-treated with the aqueous wetting agent composition and then the metal surface is bonded to polymeric material by any conventional process.

In another embodiment of the present invention, the adhesion-promoting step may be a process for converting cupric-based organometallic compounds on a copper surface into cuprous-based organometallic conversion coatings. Such a process is achieved by reduction and/or by partial dissolution of the organometallic coating, and optionally applying a copper oxidation inhibitor at the same time.

The reduction and/or dissolution composition contains a reducer and/or dissolution agent, and optionally a copper oxidation inhibitor. Examples of reducers include, but are not limited to, DMAB (dimethylaminoborane), diethylaminoborane, morpholine borane and the like. Other suitable reducers include ammonium, alkali and/or alkaline earth metal borohydrides, hypophosphites, sulfites, bisufites, hydrosulfites, metabisulfites, dithionates, tetrathionates, thiosulfates, thioureas, hydrazines, hydroxylamines, aldehydes (including formaldehyde and glyoxal), glyoxylic acid and reducing sugars. Electric current may be used as well.

Dissolution agents employed may include any of the known cupric ion chelators (complexors), organic or inorganic acids and/or their salts, (or a combination of them,), can be utilized for the present application. Such dissolution agents include, but are not limited to, EDTA (ethylenediamine-tetrancetic acid), HEEDTA, NTA (nitrilotriacetic acid), DTPA (diethylenetriamine pentaacetic acid), DCTA, Quadrol (ethoxylated/propoxylated ethylene diamine derivative available from BASF), organic phosphates (Dequests), organic acids (citric, tartaric, gluconic, glutamic, sulfamic, glycolic, glycino, malic, maleic, salicylic, ascorbic, formic, and the like), inorganic acids (hydrochloric, hydrofluoric, hydrobromic, nitric, chromic acids, and the like), and/or their ammonium hydroxide, pyrophosphates, and the like. Quadrol, EDTA and phosphanates are preferred. Additionally, it may be advantageous to use the dissolution agents with one or more reducing agents.

Suitable oxidation inhibitors or corrosion inhibitors are disclosed above. Cationic, amphoteric, anionic and/or non-ionic surfactants may also be utilized in the adhesion-promoting solution to enhance the effectiveness of the adhesion-promoting solution.

Proper pH, temperature, concentrations of components as well as treatment time are adjusted appropriately as may be desired to promote optimal reduction and/or dissolution. Optimal conditions can be readily determined empirically, i.e. a series of substrates can be treated in accordance with invention under varying conditions and the completed laminated substrates can be tested for adhesion integrity (peel strength) between the metal substrate and the polymer laminate. Preferred conditions also are disclosed in the examples which follow.

After the cupric-based organometallic compounds on the copper surface is converted into cuprous-based organometallic compounds by reduction and/or dissolution, the copper is post-treated with the aqueous wetting composition. The copper surface may be rinsed with water before and/or after the post-treatment followed by placing the polymer material on the copper surface.

The following examples further describes the process and composition of the present invention, however, the examples are not intended to limit the scope of the invention.

EXAMPLES 1–12

The following 12 examples show improved adhesion between copper surfaces and polymeric materials after the copper surfaces were treated with the post-treatment aqueous wetting composition of the present invention. Adhesion between the copper surfaces and the polymeric materials was measured by peel strength.

Twelve 30.5 cm×30.5 cm RTF® copper foils each having a thickness of about 4 mm were employed. Each copper foil was treated with an aqueous adhesion-promoting solution of Circubond Treatment 180® bath formulation (obtainable from Shipley Company, Marlborough, Mass.). The composition of the Circubond Treatment 180® bath formulation is given below:

| | |
|---|---|
| Sulfuric acid (50%) | 9% by Volume |
| Hydrogen Peroxide (35%) | 3.5% by Volume |
| Benzotriazole | 9 gr/l |
| Tetrabutylammonium chloride (TBAC) | 12–18 ppm |
| Water | Balance |

Treatment was provided for in a conveyorized flood machine. Each copper foil was exposed to the adhesion-promoting solution for about 60 seconds. The copper foils in Examples 3–7, 9 and 11 were rinsed with distilled water after treatment. All foils, except the foil of Example 1 (control), were then post-treated with a 2 gm per liter aqueous solution of polyethylene glycol (PEG) by dipping each copper foil into the solution for about 60 seconds. The temperatures of the post-treatment solutions for Examples 3, 5, 7, 9, 10 and 12 were at about 20° C., and the post-treatment solutions for the remainder of the Examples, except for Example 1, were at temperatures of about 30° C. After post-treatment, the copper foils from Examples 2–5, 7 and 11–12 were rinsed with distilled water. All of the foils were then pressed using Nelco® pre peg (polyethylene polymer), one sheet of 7628, 4000® series and two sheets of 1080, 4000® series. The press was done using the Wabash® press standard press cycle of about 1 hour and 45 minutes. Peel strength testing was then performed on the foils by means of the standard apparatus employed in the industry, an Instron® Peel Tester model No. 2530-437. The peel strength is the force measured in pounds per square inch required to separate the foil from the pre preg material. The results are given below:

| Example | Aqueous Rinse (distilled water) | Post-Treatment (2 gm/liter PEG) | Aqueous Rinse (distilled water) | Peel Strength (lbs/in$^2$) |
|---|---|---|---|---|
| 1 (Control) | NO | NO | NO | 5.7 |
| 2 | NO | YES | YES | 6.3 |
| 3 | YES | YES | YES | 6.4 |
| 4 | YES | YES | YES | 6.5 |
| 5 | YES | YES | YES | 6.6 |
| 6 | YES | YES | NO | 6.8 |
| 7 | YES | YES | YES | 6.8 |
| 8 | NO | YES | NO | 6.9 |
| 9 | YES | YES | NO | 7.0 |
| 10 | NO | YES | NO | 7.1 |
| 11 | YES | YES | YES | 7.2 |
| 12 | NO | YES | YES | 7.3 |

The data show that post-treatment of an adhesion-promoting solution with an aqueous wetting composition of the present invention improves adhesion between a copper surface and a polymer material. The peel strength for the control of Example 1 had a peel strength of 5.701 lbs/in$^2$. In contrast, the peel strengths for all the other copper foils had peel strengths of 6.3 to as high as 7.3. Accordingly, multi-layer circuit boards treated with the post-treatment method of the present invention will have improved bond integrity such that workers in the circuit board industry can readily handle the boards throughout the many manufacturing steps without concern that the boards may delaminate.

Importantly, the post-treatment method of the present invention increases the external life of the multilayer circuit boards such that the electronic products that they are used in have a longer functional life than if they were not post-treated. Thus the multilayer boards do not readily delaminate over long use.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for treating a metal surface comprising:
   a) contacting the metal surface with an adhesion promotion composition to form a micro-roughened conversion coating on the metal surface, the adhesion promotion composition comprises an oxidizer, an acid, and a corrosion inhibitor;
   b) contacting the micro-roughened conversion coated metal surface with an alkaline composition; and then
   c) contacting the micro-roughened conversion coated metal surface with an aqueous wetting composition to prepare the micro-roughened conversion coated metal surface to receive a polymer material, the wetting composition comprises polyethylene glycol, poly (ethylene oxide/propylene oxide) copolymers or mixtures thereof.

2. The method of claim 1, wherein the oxidizer comprises peroxide, persulfates, or mixtures thereof.

3. The method of claim 1 wherein the acid comprises sulfuric acid.

4. The method of claim 1 wherein the corrosion inhibitor comprises triazoles, benzotriazoles, imidazoles, benzimidazoles tetrazoles or mixtures thereof.

5. The method of claim 1 wherein the alkaline composition comprises a solution of alkali metal hydroxides, alkali metal carbonates, alkali metal phosphates, amines or mixtures thereof.

6. The method of claim 1 wherein the adhesion promotion composition further comprises a source of halide ions.

7. The method of claim 1 further comprising the step of placing a polymer material on the micro-roughened conversion coated metal surface after contacting the metal surface with the wetting agent composition.

8. A method of treating a metal surface comprising:
 a) contacting the metal surface with an adhesion promotion composition to form a micro-roughened conversion coated surface on the metal surface and to reduce the metal surface, the adhesion promotion composition comprises a reducer, dissolution agent or mixtures thereof; and then
 b) contacting the micro-roughened and reduced surface with a aqueous wetting composition to prepare the micro-roughened and reduced metal surface for receiving a polymeric material, the aqueous wetting composition comprises from about 0.5% to about 30% by weight of a wetting agent.

9. The method of claim 8, wherein the wetting agent comprises glycols, glycol ethers, glycol acetates, pol (alkylene oxide) polymers or mixtures thereof.

10. The method of claim 8, wherein the reducer comprises aminoboranes, ammonium, alkali metal borohydrides, hypophosphites, alkaline earth metal borohydrides, alkaline earth metal hypophosphites, aldehydes, glyoxylic acid, reducing sugars or mixtures thereof.

11. The method of claim 8, wherein the dissolution agents comprise EDTA, HEEDTA, NTA, DTPA, DCTA, Quadrol, organic phosphonates, organic acids, inorganic acids, ammonium, amines or mixtures thereof.

12. The method of claim 8, wherein the adhesion promotion composition further comprises a corrosion inhibitor.

13. The method of claim 12, wherein the corrosion inhibitor comprises azole derivatives comprising benzotriazole, tolyltriazole, or mixtures thereof.

14. The method of claim 8, further comprising the step of placing a polymeric material on the surface of metal surface after treating the metal surface with the aqueous wetting agent composition.

* * * * *